United States Patent
Lee et al.

(10) Patent No.: US 8,470,704 B2
(45) Date of Patent: Jun. 25, 2013

(54) NONVOLATILE MEMORY DEVICE AND METHOD OF FORMING THE NONVOLATILE MEMORY DEVICE INCLUDING GIVING AN UPPER PORTION OF AN INSULATING LAYER AN ETCHING SELECTIVITY WITH RESPECT TO A LOWER PORTION

(75) Inventors: Seung-Jun Lee, Suwon-si (KR); Woon-Kyung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/571,502

(22) Filed: Aug. 10, 2012

(65) Prior Publication Data
US 2012/0302053 A1 Nov. 29, 2012

Related U.S. Application Data

(62) Division of application No. 12/275,369, filed on Nov. 21, 2008, now Pat. No. 8,264,025.

(30) Foreign Application Priority Data

Nov. 30, 2007 (KR) .................. 10-2007-0123596

(51) Int. Cl.
*H01L 21/336* (2006.01)
(52) U.S. Cl.
USPC ............ 438/594; 257/E21.682; 257/E27.103; 438/257
(58) Field of Classification Search
USPC .................. 257/315–319, E21.68, E21.682, 257/E27.103; 438/594, 257
See application file for complete search history.

(56) References Cited

U.S. PATENT DOCUMENTS

| | | | |
|---|---|---|---|
| 5,814,543 A | 9/1998 | Nishimoto et al. | |
| 5,959,333 A | 9/1999 | Gardner et al. | |
| 6,462,373 B2 | 10/2002 | Shimizu et al. | |
| 7,420,259 B2 | 9/2008 | Mori et al. | |
| 7,601,588 B2 * | 10/2009 | Choi et al. | 438/257 |
| 2003/0119263 A1 * | 6/2003 | Lee et al. | 438/259 |
| 2004/0099900 A1 | 5/2004 | Iguchi et al. | |
| 2005/0047261 A1 | 3/2005 | Kai et al. | |
| 2006/0060913 A1 | 3/2006 | Ozawa | |
| 2006/0281244 A1 | 12/2006 | Ichige et al. | |
| 2006/0281261 A1 | 12/2006 | Kim | |
| 2007/0007582 A1 | 1/2007 | Hatakeyama | |
| 2007/0111441 A1 | 5/2007 | Koh et al. | |

FOREIGN PATENT DOCUMENTS

| | | |
|---|---|---|
| KR | 1020050057788 A | 6/2005 |
| KR | 1020060082670 A | 7/2006 |

* cited by examiner

*Primary Examiner* — John C Ingham
(74) *Attorney, Agent, or Firm* — Volentine & Whitt, PLLC

(57) ABSTRACT

A nonvolatile memory device and a method of forming a nonvolatile memory device are provided. The nonvolatile memory device includes an active region of a semiconductor substrate defined by a device isolation layer, a tunnel insulating structure disposed on the active region, and a charge storage structure disposed on the tunnel insulating structure. The nonvolatile memory device also includes a gate interlayer dielectric layer disposed on the charge storage structure, and a control gate electrode disposed on the gate interlayer dielectric layer. The charge storage structure includes an upper charge storage structure and a lower charge storage structure, and the upper charge storage structure has a higher impurity concentration than the lower charge storage structure.

7 Claims, 15 Drawing Sheets

NONVOLATILE MEMORY DEVICE AND METHOD OF FORMING THE NONVOLATILE MEMORY DEVICE INCLUDING GIVING AN UPPER PORTION OF AN INSULATING LAYER AN ETCHING SELECTIVITY WITH RESPECT TO A LOWER PORTION

CROSS-REFERENCE TO RELATED APPLICATION

This application is a Divisional of application Ser. No. 12/275,369, filed Nov. 21, 2008, which claims the benefit of Korean Patent Application No. 10-2007-0123596, filed on Nov. 30, 2007, the subject matter of which is hereby incorporated by reference.

BACKGROUND

Embodiments of the invention relate to a semiconductor memory device and a method of forming the semiconductor memory device. In particular, embodiments of the invention relate to a nonvolatile memory device and a method of forming the nonvolatile memory device.

A nonvolatile memory device retains data stored in the device even when there is an interruption in the supply of power to the device. A flash memory device can store data by selectively storing electric charge in a floating gate disposed between a control gate and a semiconductor substrate. In a flash memory device, adjacent floating gates may electrically interfere with one another. Thus, the floating gates need to be electrically shielded to reduce such interference. The control gate electrode is disposed between adjacent floating gates and on a device isolation layer in order to perform a shielding function. Since the control gate and an active region disposed under the floating gate may interfere with one another, the distance between an edge of the active region and the control gate electrode needs to be spatially uniform in the nonvolatile memory device. To meet that need, the thickness of the device isolation layer needs to be controlled such that it is spatially uniform in the nonvolatile memory device.

SUMMARY

Embodiments of the invention provide a nonvolatile memory device having a charge storage structure comprising an upper charge storage structure and a lower charge storage structure, wherein the upper charge storage structure has a higher impurity concentration than the lower charge storage structure. Embodiments of the invention also provide a method of forming a nonvolatile memory device comprising treating the insulating layer to give an upper portion of the insulating layer an etching selectivity with respect to a lower portion of the insulating layer relative to an etching process.

In accordance with at least one embodiment, the invention provides a nonvolatile memory device comprising an active region of a semiconductor substrate defined by a device isolation layer, a tunnel insulating structure disposed on the active region, and a charge storage structure disposed on the tunnel insulating structure. The nonvolatile memory device further comprises a gate interlayer dielectric layer disposed on the charge storage structure, and a control gate electrode disposed on the gate interlayer dielectric layer. The charge storage structure comprises an upper charge storage structure and a lower charge storage structure, and the upper charge storage structure has a higher impurity concentration than the lower charge storage structure.

Also, in accordance with at least one embodiment, the invention provides a nonvolatile memory device comprising an active region of a semiconductor substrate defined by a device isolation layer, wherein the device isolation layer comprises a device isolation layer segment, a tunnel insulating structure disposed on the active region, and a charge storage structure disposed on the tunnel insulating structure. The charge storage structure comprises an upper charge storage structure and a lower charge storage structure, and the upper charge storage structure has a higher impurity concentration than the lower charge storage structure. The nonvolatile memory device further comprises a gate interlayer dielectric layer disposed on the charge storage structure, and a control gate electrode disposed on the gate interlayer dielectric layer and a recessed region of the device isolation layer segment.

In addition, in accordance with at least one embodiment, the invention provides a method of forming a nonvolatile memory device. The method comprises forming a preliminary structure comprising an active region defined by an insulating layer in a semiconductor substrate, a tunnel insulating structure disposed on the active region, and a charge storage structure disposed on the tunnel insulating structure. The method further comprises treating the insulating layer to give an upper portion of the insulating layer an etching selectivity with respect to a lower portion of the insulating layer relative to a first etching process, etching the insulating layer using at least the first etching process to form a device isolation layer, and recessing the device isolation layer.

BRIEF DESCRIPTION OF THE DRAWINGS

Embodiments of the invention will be described herein with reference to the accompanying drawings, in which.

DESCRIPTION OF EMBODIMENTS

Figure 1:
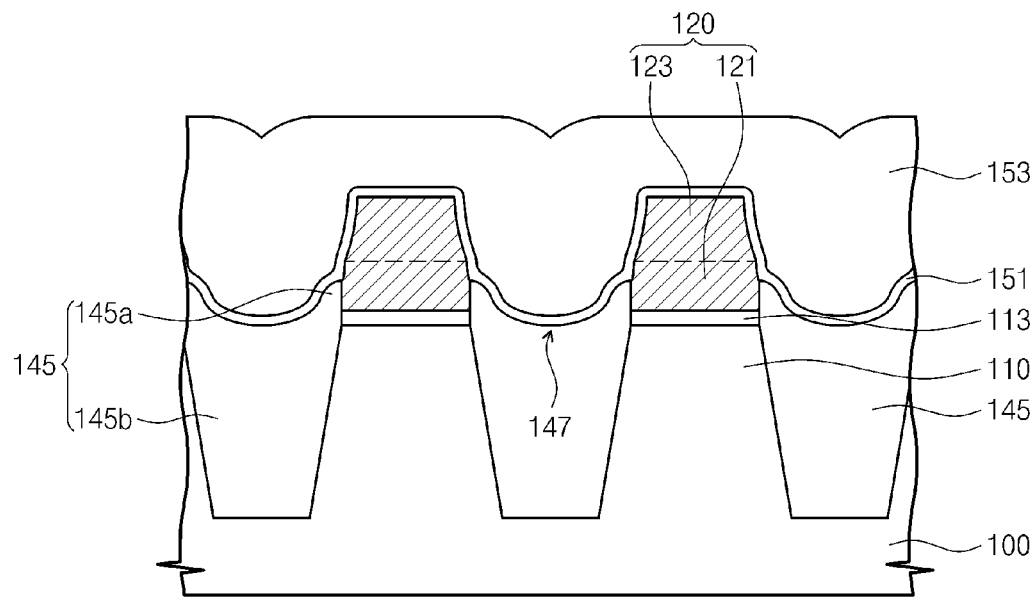
FIG. 1 is a cross-sectional view illustrating a nonvolatile memory device in accordance with an embodiment of the invention.

Embodiments of the invention now will be described with reference to the accompanying drawings, in which like reference symbols refer to like elements throughout. In addition, elements illustrated in the drawings are not necessarily drawn to scale. For example, the sizes and relative sizes of layers and regions may be exaggerated. In addition, although a plurality of the same element may be shown in a drawing, only one of each element will generally be described herein for convenience of description.

FIG. 1 is a cross-sectional view illustrating a nonvolatile memory device in accordance with an embodiment of the invention. Referring to FIG. 1, a nonvolatile memory device in accordance with an embodiment of the invention comprises a semiconductor substrate 100 having a cell region. FIG. 1 shows a portion of the cell region of semiconductor substrate 100. An active region 110 is defined in semiconductor substrate 100 by a device isolation layer 140 (see FIG. 6A) comprising a plurality of device isolation layer segments 145. A tunnel insulating structure 113 and a charge storage structure 120 are sequentially stacked on active region 110. In the embodiment illustrated in FIG. 1, each device isolation layer segment 145 comprises a recessed region 147 disposed at the center of the device isolation layer segment 145. For example, as illustrated in FIG. 1, a recessed region 147 may be disposed in device isolation layer segment 145 disposed and centered between adjacent active regions 110. In addition, a gate interlayer dielectric layer 151 is conformally disposed on charge storage structure 120 and device isolation layer segments 145. A control gate electrode 153 is disposed on gate interlayer dielectric layer 151.

Tunnel insulating structure 113 may be disposed on an active region 110 and may be formed to have a thickness of 50-100 Å using In-Situ Stream Generation (ISSG). As an example, to form tunnel insulating structure 113, hydrogen and oxygen may be injected into a chamber to form an oxide layer at a temperature of 850-900° C. and under a pressure of 5-100 Torr.

Device isolation layer 140 may be formed through a self-aligned shallow trench isolation technique. Charge storage structure 120 comprises a lower charge storage structure 121 and an upper charge storage structure 123, and a device isolation layer segment 145 may be disposed adjacent to lower charge storage structure 121. In addition, each device isolation layer segment 145 may comprise an upper device isolation layer segment 145a and a lower device isolation layer segment 145b. Upper device isolation layer segment 145a is adjacent to lower charge storage structure 121 of charge storage structure 120. Additionally, an upper surface of upper device isolation layer segment 145a is disposed above an upper boundary of lower device isolation layer 145b. Device isolation layer 140 may be a silicon oxide layer. In addition, a lower surface of recessed region 147 of a device isolation layer segment 145 may be disposed higher than an upper surface of active region 110. The lower surface of recessed region 147 may be disposed higher than the upper surface of active region 110 in order to reduce electrical interference between active region 110 and the portion of control gate electrode 153 disposed on recessed region 147. In addition, in the embodiment illustrated in FIG. 1, at least a portion of the upper surface of upper device isolation layer segment 145a is the same as the lower surface of recessed region 147. Similarly, the upper surface of upper device isolation layer segment 145a is the same as an upper surface of device isolation layer segment 145. In addition, as used herein, when a first element, surface, boundary, or portion thereof is said to be "higher than" a second element, surface, boundary, or portion thereof, it means that the first element, surface, boundary, or portion thereof is disposed further from a plane passing through the corresponding substrate (e.g., substrate 100) and parallel to a working surface of the substrate than the second element, surface, boundary, or portion thereof, wherein both are disposed on the same side of the plane. The "working surface" of the substrate may be defined as, for example, a plane that is coplanar with the upper surfaces of active regions of the substrate. Similarly, as used herein, when a first element, surface, boundary, or portion thereof is said to be "lower than" a second element, surface, boundary, or portion thereof, it means that the first element, surface, boundary, or portion thereof is disposed closer to a plane passing through the corresponding substrate (e.g., substrate 100) and parallel to a working surface of the substrate than the second element, surface, boundary, or portion thereof, wherein both are disposed on the same side of the plane.

As noted above, charge storage structure 120 comprises an upper charge storage structure 123 and a lower charge storage structure 121. Upper charge storage structure 123 may have an impurity concentration that is higher than an impurity concentration of lower charge storage structure 121. In addition, charge storage structure 120 may be doped polysilicon. In accordance with an embodiment of the invention, upper charge storage structure 123 and lower charge storage structure 121 may comprise the same one or more substances as impurities. The one or more substances acting as impurities may be, for example, at least one of $BF_2$, B, As, and P. The impurities preferable have relatively large masses.

In accordance with an embodiment of the invention, different portions of charge storage structure 120 may have different etch rates relative to an etching process, so a side surface of charge storage structure 120 may comprise multiple different curvatures. That is, the curvature of a side surface of charge storage structure 120 may vary along the height of charge storage structure 120. For example, in the embodiment illustrated in FIG. 1, a sidewall of upper charge storage structure 123 has a different curvature than an upper portion of a sidewall of lower charge storage structure 121. Additionally, the width of charge storage structure 120 varies more than twice along the height of charge storage structure 120. Different portions of charge storage structure 120 may have different etch rates relative to an etching process when, for example, the different portions of charge storage structure 120 have different impurity concentrations.

The width of at least a portion of lower charge storage structure 121 may be equal to the width of an upper surface of active region 110, when, for example, a self-aligned technique is used in forming charge storage structure 120 and active region 110. Additionally, the respective widths of various portions of lower charge storage structure 121 may be greater than the respective widths of various portions of upper charge storage structure 123. In accordance with an alternate embodiment of the invention, a width of at least a portion of lower charge storage structure 121 may be greater than the width of an upper surface of active region 110. In addition, charge storage structure 120 may be formed from polysilicon. As used herein, the "height" of an element is the distance between the upper and lower surfaces of the element. In addition, when the width of an element is said to "vary along the height" of the element, it means that the element has at least two different widths at at least two different points between the upper surface and the lower surface of the element.

Gate interlayer dielectric layer 151 is conformally formed on charge storage structure 120 and device isolation layer 145. Gate interlayer dielectric layer 151 may comprise a three layer structure comprising a silicon oxide layer, a silicon nitride layer, and a silicon oxide layer. Gate interlayer dielectric layer 151 may comprise a dielectric layer having a relatively high dielectric constant, such as a layer comprising metal. Gate interlayer dielectric layer 151 may be an aluminum oxide layer, an yttrium oxide layer, a hafnium oxide layer, a tantalum oxide layer, a zirconium oxide layer, a titanium oxide layer, or a layer comprising a material from one of the previously recited layers along with nitrogen or silicon. Alternatively, gate interlayer dielectric layer 151 may comprise at least one of an aluminum oxide layer, an yttrium oxide layer, a hafnium oxide layer, a tantalum oxide layer, a zirconium oxide layer, and a titanium oxide layer. Gate interlayer dielectric layer 151 may comprise a material having a higher dielectric constant than tunnel insulating structure 113.

Control gate electrode 153 is conformally formed on gate interlayer dielectric layer 151. Control gate electrode 153 may be doped polysilicon. Control gate electrode 153 may comprise at least one of metal, a metal nitride layer, a metal silicide, and a metal compound.

Figure 2:
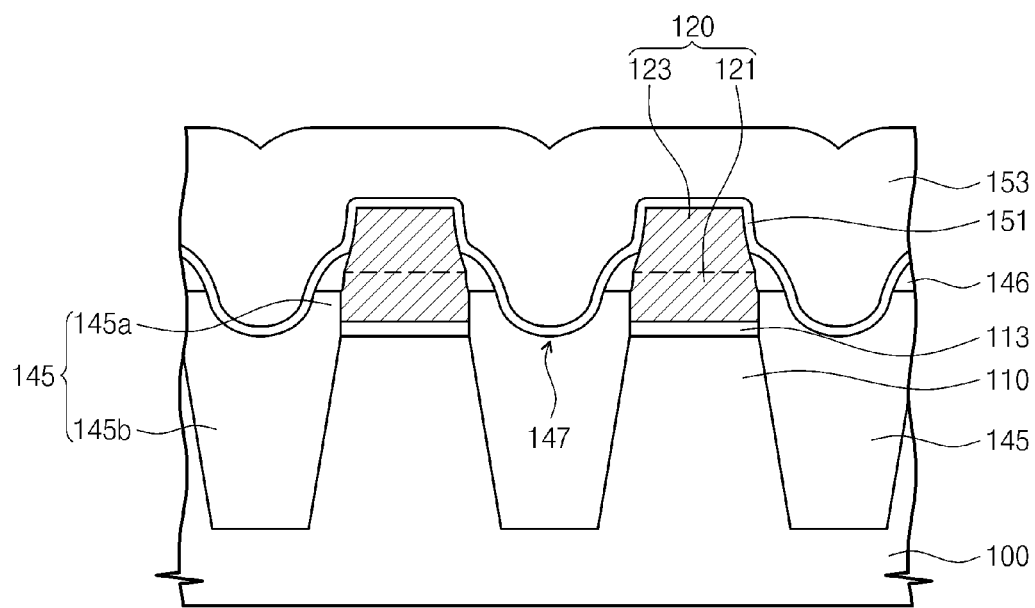
FIG. 2 is a cross-sectional view illustrating a nonvolatile memory device in accordance with another embodiment of the invention.

FIG. 2 is a cross-sectional view illustrating a nonvolatile memory device in accordance with another embodiment of the invention. The description of features common to the devices of FIGS. 1 and 2 and already discussed in relation to FIG. 1 may be omitted here. Referring to FIGS. 1 and 2, device isolation layer segment 145 comprises an upper device isolation layer segment 145a and a lower device isolation layer segment 145b. Upper device isolation layer segment 145a is adjacent to tunnel insulating structure 113. A spacer 146 is disposed on upper device isolation layer segment 145a. Spacer 146 may be in contact with a sidewall of upper charge storage structure 123 and/or a sidewall of lower charge storage structure 121. Spacer 146 may comprise at least one of a silicon oxide layer, a silicon nitride layer, and a silicon oxynitride layer. Spacer 146 may also have a sidewall shape. In addition, a lower surface of spacer 146 may be disposed higher than a lower surface of lower charge storage structure 121. Also, an upper surface of spacer 146 may be disposed lower than an upper surface of upper charge storage structure 123. In addition, in the embodiment illustrated in FIG. 2, at least a portion of the upper surface of upper device isolation layer segment 145a is the same as the lower surface of recessed region 147.

FIGS. 3A-3H are cross-sectional views illustrating a method of forming a nonvolatile memory device in accordance with an embodiment of the present invention.

Figure 3A:
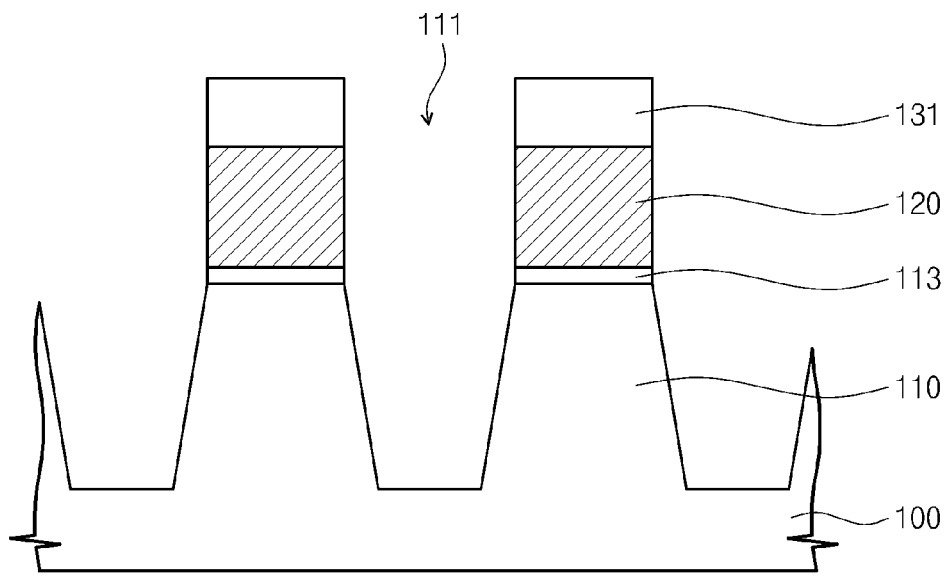
FIGS. 3A-3H are cross-sectional views illustrating a method of forming a nonvolatile memory device in accordance with an embodiment of the invention.

Referring to FIG. 3A, a tunnel insulating layer (not shown), a charge storage layer (not shown), and a hard mask layer (not shown) are stacked on a semiconductor substrate 100. The hard mask layer, the charge storage layer, the tunnel insulating layer, and semiconductor substrate 100 are then sequentially patterned to form a trench 111, and a tunnel insulating structure 113, a charge storage structure 120, and a hard mask structure 131 are formed on semiconductor substrate 100 as a result. In addition, trench 111 is aligned with a sidewall of charge storage structure 120. After trench 111 is formed, a sacrificial oxidation process for curing any damage of a sidewall of trench 111 may be performed. The tunnel insulating layer may comprise at least one of a silicon oxide layer and a silicon oxynitride layer, the charge storage layer may be doped polysilicon or a conductive layer, and the hard mask layer may comprise at least one of a silicon oxide layer, a silicon nitride layer, and a silicon oxynitride layer.

Figure 3B:
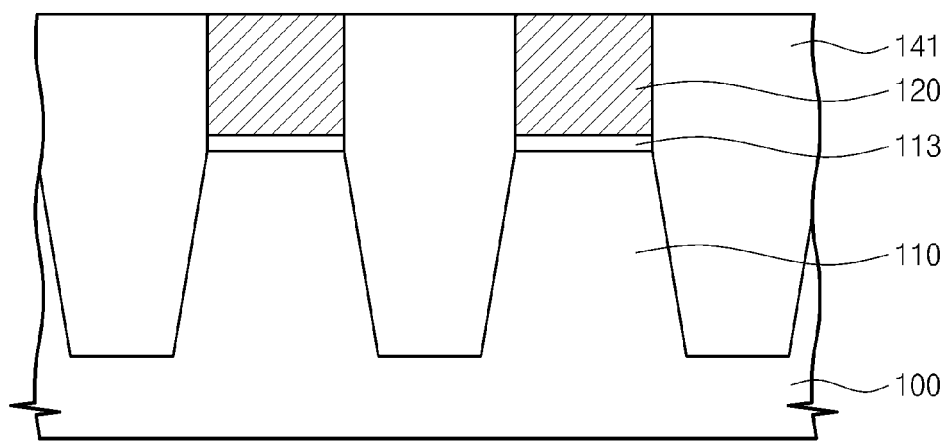

Referring to FIG. 3B, hard mask structure 131 may be removed. Trench 111 is filled with a preliminary insulating layer (not shown). The preliminary insulating layer may be a silicon oxide layer. In addition, the preliminary insulating layer may be formed from a combination of more than one of a HTO layer, a PE-TEOS layer, MTO layer, HDP layer, and a SOG layer. The preliminary insulating layer may be planarized down to an upper surface of charge storage structure 120. As a result, an insulating layer 141 for isolating a device is formed between a plurality of charge storage structures 120. An upper surface of insulating layer 141 may be coplanar with the upper surface of charge storage structure 120. In addition, the planarization may be performed using a chemical mechanical polishing (CMP) process. After forming insulating layer 141, a preliminary structure, as illustrated in FIG. 3B, is complete. That is, the structure illustrated in FIG. 3B may be referred to herein as a "preliminary structure".

Figure 3C:
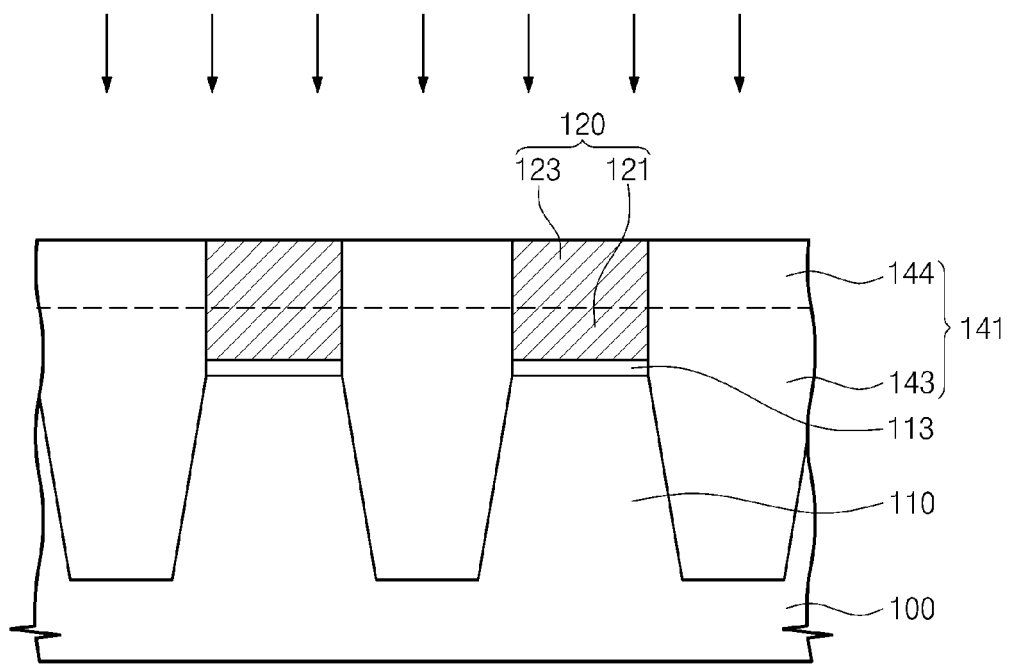

Referring to FIG. 3C, insulating layer 141 may be treated so that an upper portion 144 of insulating layer 141 has an etching selectivity with respect to a lower portion 143 of insulating layer 141 relative to a selected etching process. Specifically, insulating layer 141 may be divided into an upper portion 144 and a lower portion 143 by performing an ion implantation process on the preliminary structure illustrated in FIG. 3B. The impurity concentration of upper portion 144 is preferably uniform along a height of upper portion 144. In addition, an etch rate of upper portion 144 can be made uniform by providing upper portion 144 with a uniform impurity concentration. Ion implantation energy may be varied so that impurities are implanted uniformly along the height of upper portion 144. In addition, an impurity concentration of upper portion 144 may be higher than an impurity concentration of lower portion 143. The ion implantation process is performed to give upper portion 144 and lower portion 143 different etch rates in relation to a selected etching process (i.e., an etching process having a selected etching recipe). In addition, the ion implantation process divides the unitary structure of device isolation layer 141 with respect to impurity concentration, so selective etching of a portion of device isolation layer 141 may be more readily achieved after the ion implantation process. It is desirable to use ions having relatively large masses as the impurities in order to divide the unitary structure of device isolation layer 141 with respect to impurity concentration. Impurities used in the ion implantation process may include at least one of As, B, P, and $BF_2$. In addition, the thickness of upper portion 144 depends upon the amount of energy with which ions are injected in the ion implantation process.

The ion implantation process may also subdivide charge storage structure 120 into an upper charge storage structure 123 and a lower charge storage structure 121. In addition, a lower boundary of upper portion 144 may be coplanar with a lower boundary of upper charge storage structure 123.

Figure 3D:
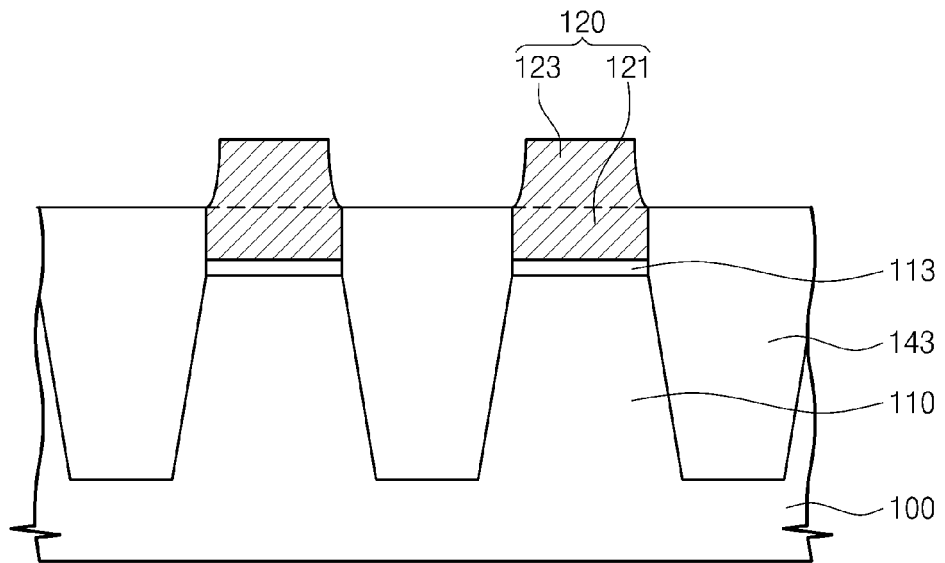

Referring to FIG. 3D, insulating layer 141 is selectively etched to remove either a portion of upper portion 144 or all of upper portion 144. After selectively etching insulating layer 141, an upper surface of insulating layer 141 is disposed lower than an upper surface of charge storage structure 120. The etch rate of upper portion 144 may be different from the etch rate of lower portion 143 relative to the etch process used to selectively etch insulating layer 141. Specifically, the etch rate of upper portion 144 is preferably greater than the etch rate of lower portion 143. Thus, upper portion 144 is selectively etched utilizing the different etch rates of upper portion 144 and lower portion 143 with respect to a selected etching process, wherein the implantation process described above provides upper portion 144 and lower portion 143 with the different etch rates. Providing upper portions 144 and lower portions 143 with different etch rates with respect to a selected etching process may improve the uniformity of the resulting thicknesses of lower portions 143 in the nonvolatile memory device after etching upper portions 144. In addition, improving the uniformity of the resulting thicknesses of lower portions 143 in the nonvolatile memory device after etching upper portions 144 may improve the reliability of the nonvolatile memory device at least by improving the uniformity of the thicknesses of device isolation layer segments 145 having recessed regions 147 in the nonvolatile memory device.

The etching process for selectively etching insulating layer 141 is preferably a wet etching process in which the etch rate of insulating layer 141 is greater than the etch rate of charge storage structure 120. In addition, a portion of upper charge storage structure 123 is etched when insulating layer 141 is selectively etched, and the width of upper charge storage structure 123 may thereby be reduced.

Figure 3E:
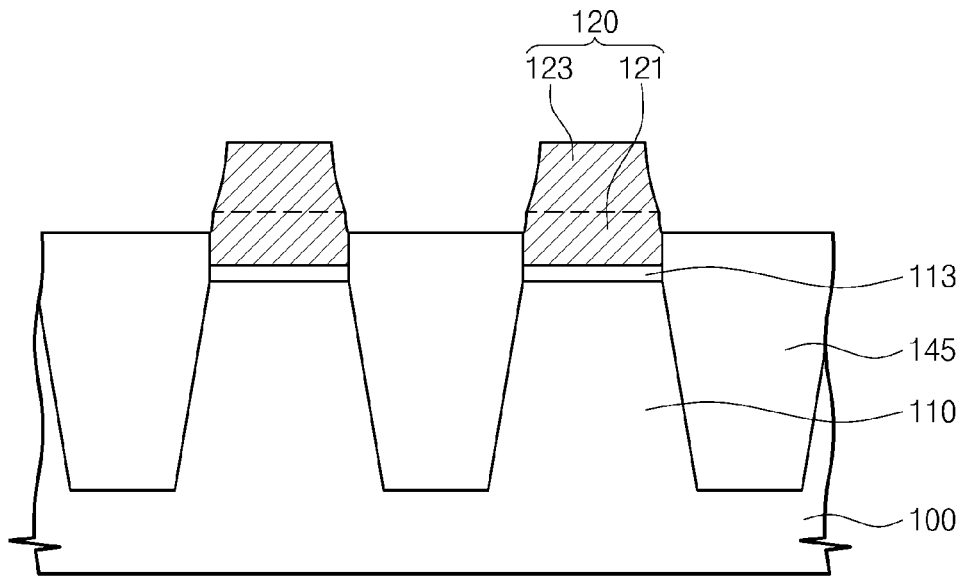

Referring to FIG. 3E, an upper surface of lower portion 143 is etched to form a device isolation layer 140 (see FIG. 6A) comprising device isolation layer segments 145. The additional etching process for etching an upper surface of upper portion 143 may be a wet etching process. As illustrated in FIG. 3E, some of lower portion 143 is removed by the additional etching process, and a portion of lower charge storage structure 121 is thereby exposed. When a portion of lower charge storage structure 121 is exposed, some of the exposed portion of lower charge storage structure 121 is removed. The width of charge storage structure 120 varies along the height of charge storage structure 120, and the removal of some of the exposed portion of lower charge storage structure 121 contributes to that variation. As illustrated in FIG. 3E, the widths of lower charge storage structure 121 at various heights thereof are greater than the widths of upper charge storage structure 123 at various heights thereof. In addition, a sidewall surface of charge storage structure 120 has at least two different curvatures along a height of charge storage structure 120.

Figure 3F:
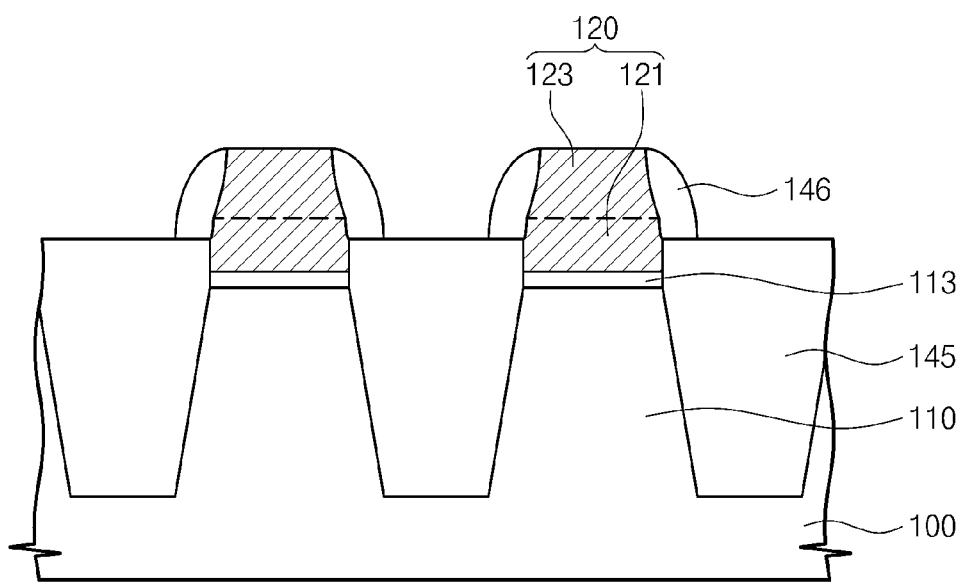

Referring to FIG. 3F, after some of the exposed portion of lower charge storage structure 121 is removed, a spacer layer (not shown) is formed on semiconductor substrate 100. The spacer layer may comprise at least one of a silicon nitride layer, a silicon oxide layer, and a silicon oxynitride layer. The spacer layer is then etched down to the upper surface of charge storage structure 120 and an upper surface of device isolation layer 140 to form a spacer 146 disposed on a sidewall of charge storage structure 120. The etching process used to etch the spacer layer may be an anisotropic etching process.

Figure 3G:
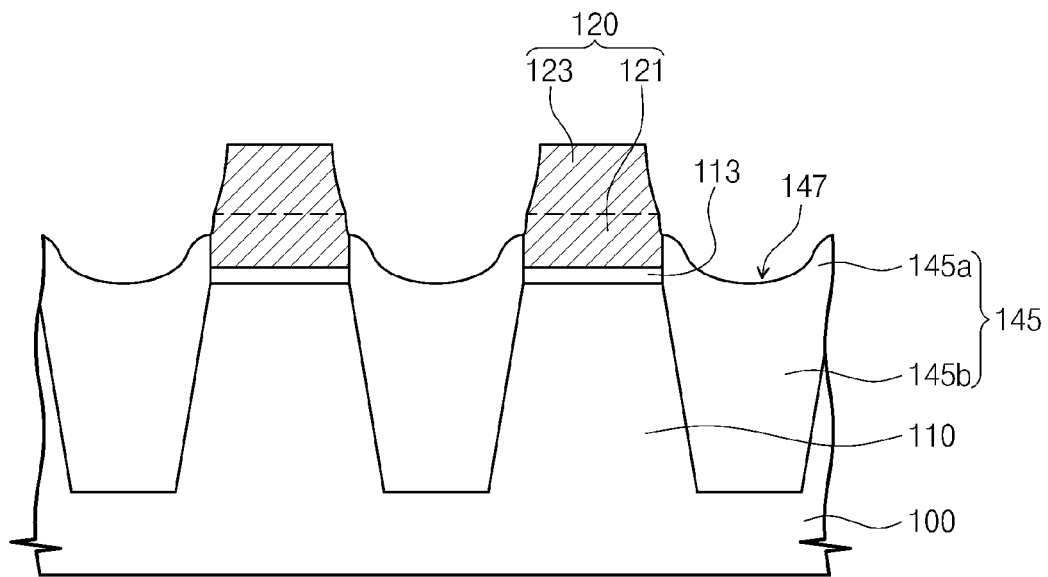

Referring to FIG. 3G, an anisotropic etching process is additionally performed to remove spacer 146. In addition, device isolation layer segment 145 is recessed, forming a recessed region 147 in device isolation layer segment 145. After recessing device isolation layer segment 145, the center of an upper surface of the device isolation layer segment 145 (i.e., the center of a lower surface of recessed region 147) is disposed lower than an outer edge region of the device isolation layer segment. A lower surface of recessed region 147 may be disposed higher than an upper surface of active region 110. In addition, at least because of the potential uniformity of the resulting thicknesses of lower portions 143 in the nonvolatile memory device after etching upper portions 144, a distance between a bottom surface of recessed region 147 and an edge region of active region 110 may be greater than or equal to a predetermined value throughout the nonvolatile memory device. Thus, electrical interference from a gate electrode disposed on recessed region 147 that affects active region 110 may be reduced in the nonvolatile memory device. Device isolation layer segment 145 may comprise an upper device isolation layer 145a and a lower device isolation layer 145b. Upper device isolation layer 145a is in contact with charge storage structure 120. In addition, an upper boundary of lower device isolation layer 145b is disposed lower than an upper surface of upper device isolation layer 145a. Also, a portion of upper device isolation layer 145a may be conformally formed on a sidewall of charge storage structure 120.

Figure 3H:
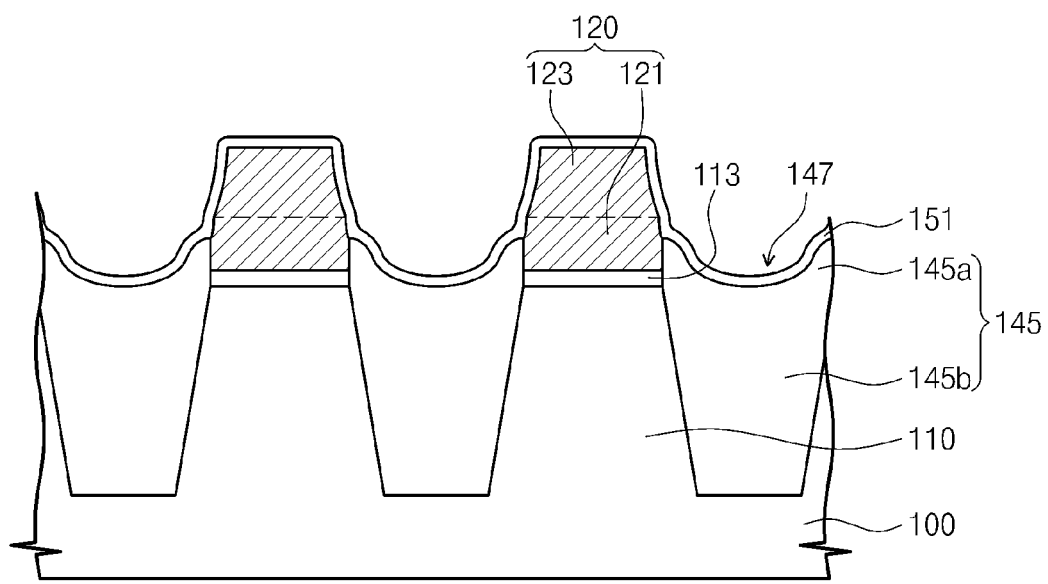

Referring to FIG. 3H, after recessed region 147 is formed in device isolation layer segment 145, a gate interlayer dielectric layer 151 may be conformally formed on charge storage structure 120 and device isolation layer segment 145. Gate interlayer dielectric layer 151 may be formed having a three layer structure comprising a silicon oxide layer, a silicon nitride layer, and a silicon oxide layer. Gate interlayer dielectric layer 151 may comprise a layer with a relatively high dielectric constant, such as a layer comprising metal. Gate interlayer dielectric layer 151 may be an aluminum oxide layer, an yttrium oxide layer, a hafnium oxide layer, a tantalum oxide layer, a zirconium oxide layer, a titanium oxide layer, or a layer comprising a material from one of the previously recited layers along with nitrogen or silicon. In accordance with another embodiment, gate interlayer dielectric layer 151 may be at least one of an aluminum oxide layer, an yttrium oxide layer, a hafnium oxide layer, a tantalum oxide layer, a zirconium oxide layer, and a titanium oxide layer. Gate interlayer dielectric layer 151 may comprise material having a dielectric constant higher than a dielectric constant of tunnel insulating structure 113.

Referring to FIG. 1 again, after forming gate interlayer insulating layer 151, a control gate electrode layer (not shown) is formed on gate interlayer insulating layer 151. The control gate electrode layer is patterned to form a control gate electrode 153. Control gate electrode 153 may be doped polysilicon. Control gate electrode 153 may comprise at least one of metal, a metal nitride layer, a metal silicide, and a metal compound.

Figure 4A:
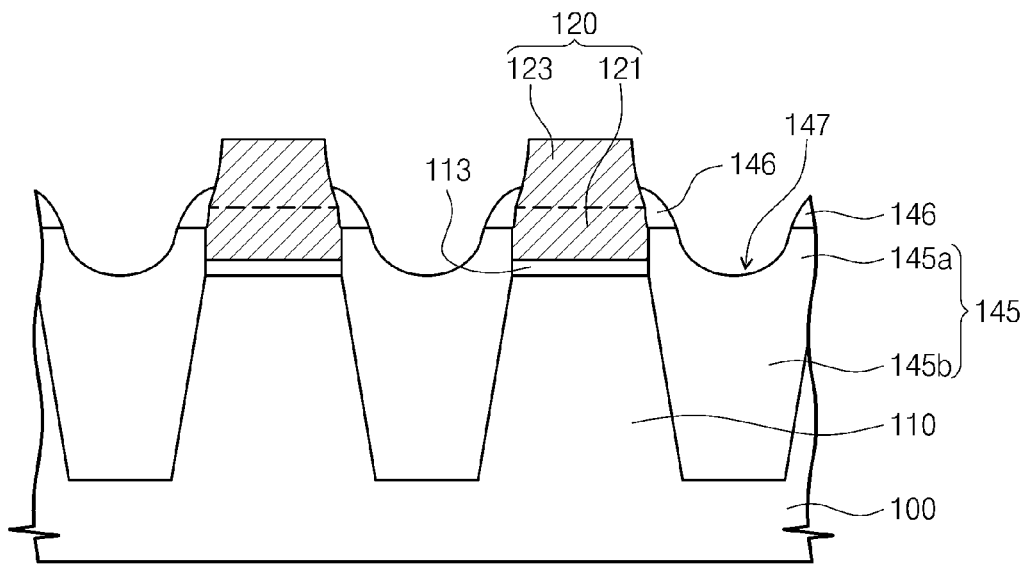
FIGS. 4A and 4B are cross-sectional views illustrating a method of forming a nonvolatile memory device in accordance with another embodiment of the invention.
Figure 4B:
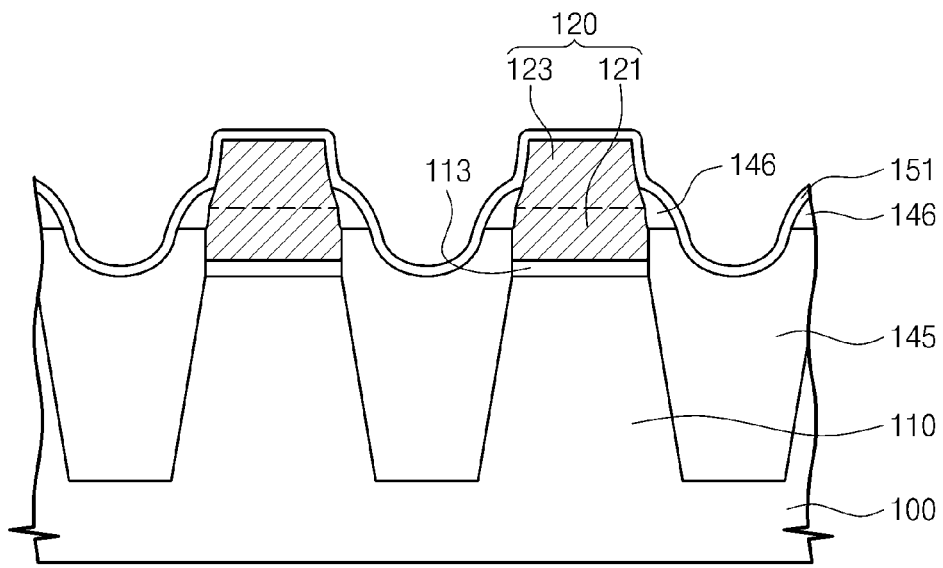

FIGS. 4A and 4B are cross-sectional views illustrating a method of forming a nonvolatile memory device in accordance with another embodiment of the invention. First, the process described in relation to FIGS. 3A to 3F is performed. Then, referring to FIG. 4A, an anisotropic etching process is performed that recesses a center portion of device isolation layer segment 145 to form recessed region 147, but also leaves a portion of spacer 146. Device isolation layer segment 145 comprises an upper device isolation layer segment 145a and a lower device isolation layer segment 145b. Upper device isolation layer segment 145a is in contact with charge storage structure 120. An upper boundary of lower device isolation layer segment 145b is disposed lower than an upper surface of upper device isolation layer segment 145a. A bottom surface of recessed region 147 may be disposed higher than an upper surface of active region 110. Upper device isolation layer segment 145a may be conformally formed on a sidewall of charge storage structure 120.

Referring to FIGS. 2 and 4B, a gate interlayer insulating layer 151 and a control gate electrode 153 are formed on semiconductor substrate 100. Since the process for forming gate interlayer insulating layer 151 and control gate electrode 153 is substantially the same as the corresponding process described in relation to the embodiment illustrated in FIGS. 3A-3H, further description thereof is omitted here.

Figure 5A:
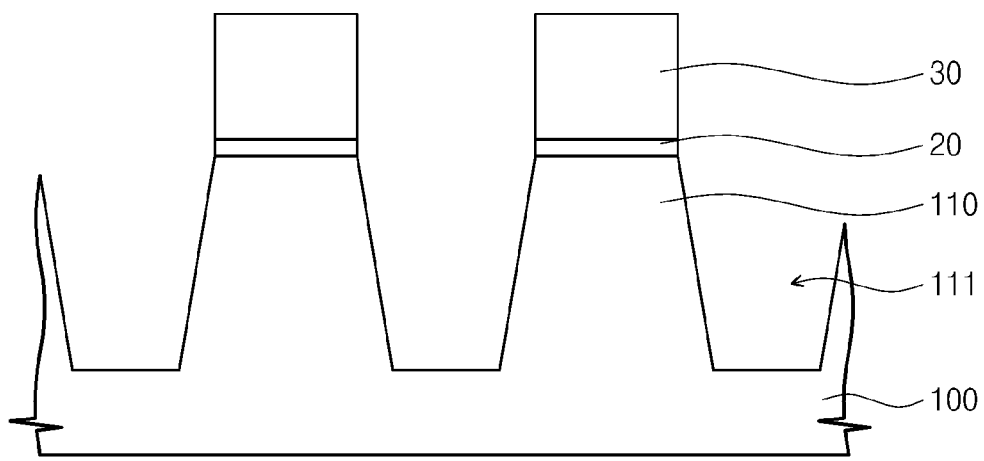
FIGS. 5A to 5E are cross-sectional views illustrating a method of forming a nonvolatile memory device in accordance with still another embodiment of the invention.

FIGS. 5A-5E are cross-sectional views illustrating a method of forming a nonvolatile memory device in accordance with still another embodiment of the present invention. Referring to FIG. 5A, a buffer oxide layer (not shown) and a hard mask layer (not shown) are sequentially stacked on a semiconductor substrate 100. The hard mask layer is then patterned to form a hard mask structure 30. Then, the buffer oxide layer and semiconductor substrate 100 are etched using hard mask structure 30 as an etching mask to form an oxide structure 20 and a trench 111. A reflection preventing layer may be further formed on the hard mask. The buffer oxide layer functions as a layer for buffering a stress caused by the hard mask. The hard mask layer may be a laminated structure of a silicon nitride layer, a polysilicon layer, a silicon nitride layer and a polysilicon layer, or a silicon nitride layer and a silicon oxide layer. The etching process may be an anisotropic etching process using plasma. After trench 111 is formed, a thermal oxidation process for curing etching damage is performed to form a thermal oxide layer inside of trench 111.

Figure 5B:
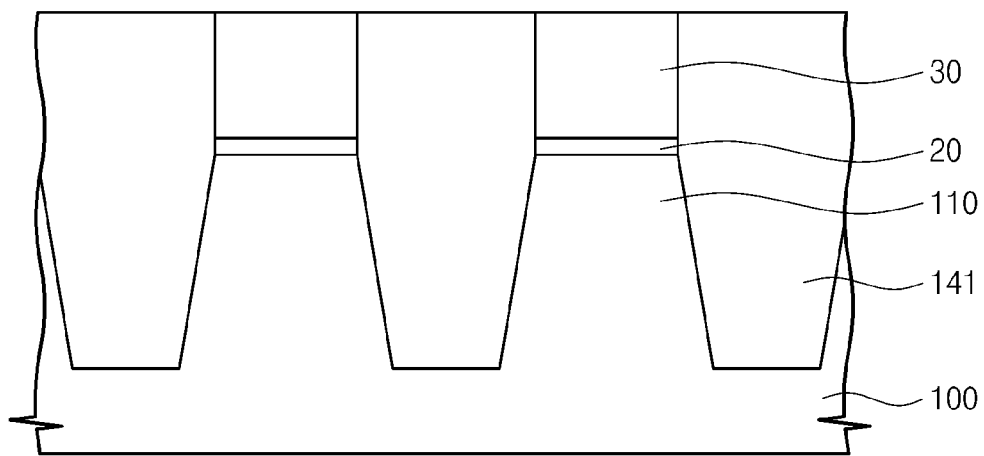

Referring to FIG. 5B, a preliminary insulating layer (not shown) is formed to fill trench 111 and a gap region defined by hard mask structures 30 and oxide structures 20. The preliminary insulating layer is formed to cover an upper surface of hard mask structure 30. The preliminary insulating layer is planarized to form an insulating layer 141 for isolating a device using a chemical mechanical polishing technique. Insulating layer 141 fills trench 111 and the gap region defined by hard mask structures 30 and oxide structures 20. The preliminary insulating layer is preferably planarized down to an upper surface of hard mask structure 30. The preliminary insulating layer may be formed from at least one of a HTO layer, a PE-TEOS layer, a MTO layer, and a SOG layer.

Figure 5C:
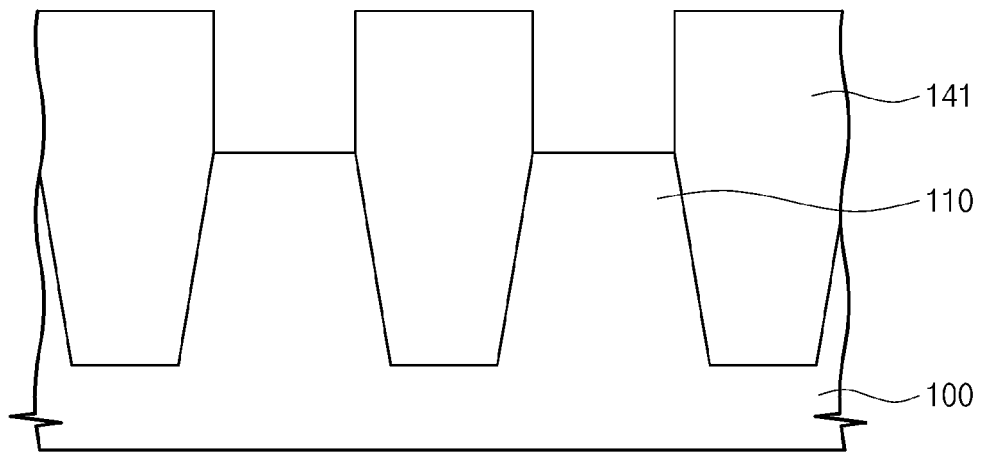

Referring to FIG. 5C, hard mask structure 30 and buffer oxide structure 20 are removed to expose semiconductor substrate 100. Hard mask structure 30 may be removed using an etching recipe that selectively etches hard mask structure 30 relative to buffer oxide structure 20 and insulating layer 141. In addition, buffer oxide structure 20 may be removed using an etching recipe that selectively etches buffer oxide structure 20 relative to semiconductor substrate 100. Buffer oxide structure 20 may also be removed using an isotropic wet etching process to prevent etching damage that may be caused by an etching process using plasma.

In addition, a predetermined annealing process may be performed before removing hard mask structure 30 and buffer oxide structure 20. The annealing process makes insulating layer 141 denser, which may prevent excessive etching of insulating layer 141 while removing buffer oxide structure 20. The annealing process may be performed after hard mask structure 30 is removed. In addition, a predetermined ion implantation process that implants impurities into a portion of semiconductor substrate 100 disposed under buffer oxide structure 20 may be performed before removing buffer oxide structure 20. The annealing process can activate impurities implanted by the ion implantation process.

Since insulating layer 141 and buffer oxide structure 20 may both be formed from a silicon oxide layer, insulating layer 141 may be recessed while buffer oxide structure 20 is being removed. An upper surface of insulating layer 141 may be disposed higher than an upper surface of active region 110.

Figure 5D:
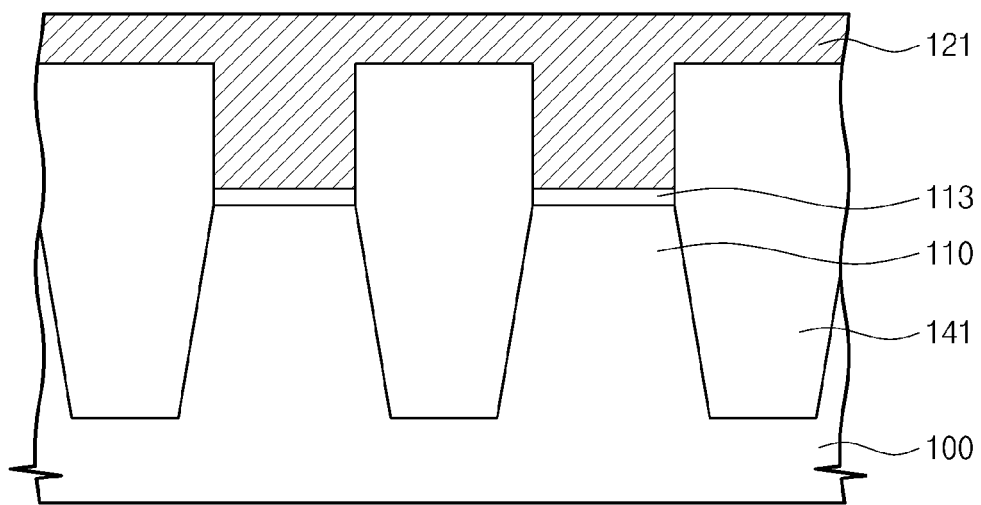

Referring to FIG. 5D, an upper surface of active region 110 is thermally oxidized to form tunnel insulating structure 113 comprising a silicon oxide layer. Tunnel insulating structure 113 may be a dielectric substance comprising a silicon oxide layer and a silicon oxynitride layer. A charge storage layer 121 covering the upper surface of active region 110 and insulating layer 141 is formed on tunnel insulating structure 113. Charge storage layer 121 may be formed from conductive materials such as polysilicon, silicon germanium, cobalt silicide, tungsten silicide, copper, aluminum, etc., or a laminated structure of at least two of those materials.

Figure 5E:
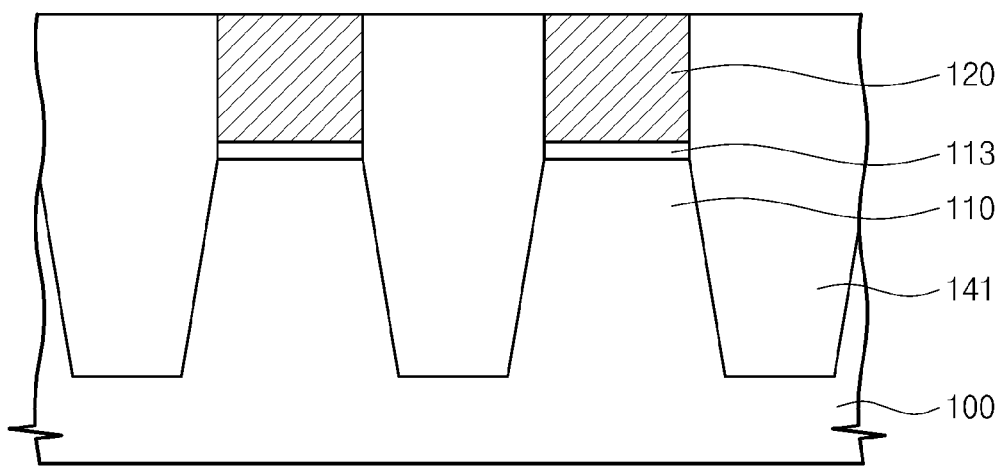

Referring to FIG. 5E, charge storage layer 121 is etched back down to an upper surface of insulating layer 141 to form charge storage structures 120. The etch-back process may be performed using a chemical mechanical polishing technique. Alternatively, the etch-back process may be performed using an over-etching process. After the etch-back process, the charge storage structures 120 that are formed are completely separated from one another. The structure illustrated in FIG. 5E may be referred to herein as a "preliminary structure". After forming charge storage structures 120, the process described in FIGS. 3C to 3H is performed. Description of the process illustrated in FIGS. 3C to 3H will not be repeated here.

Figure 6A:
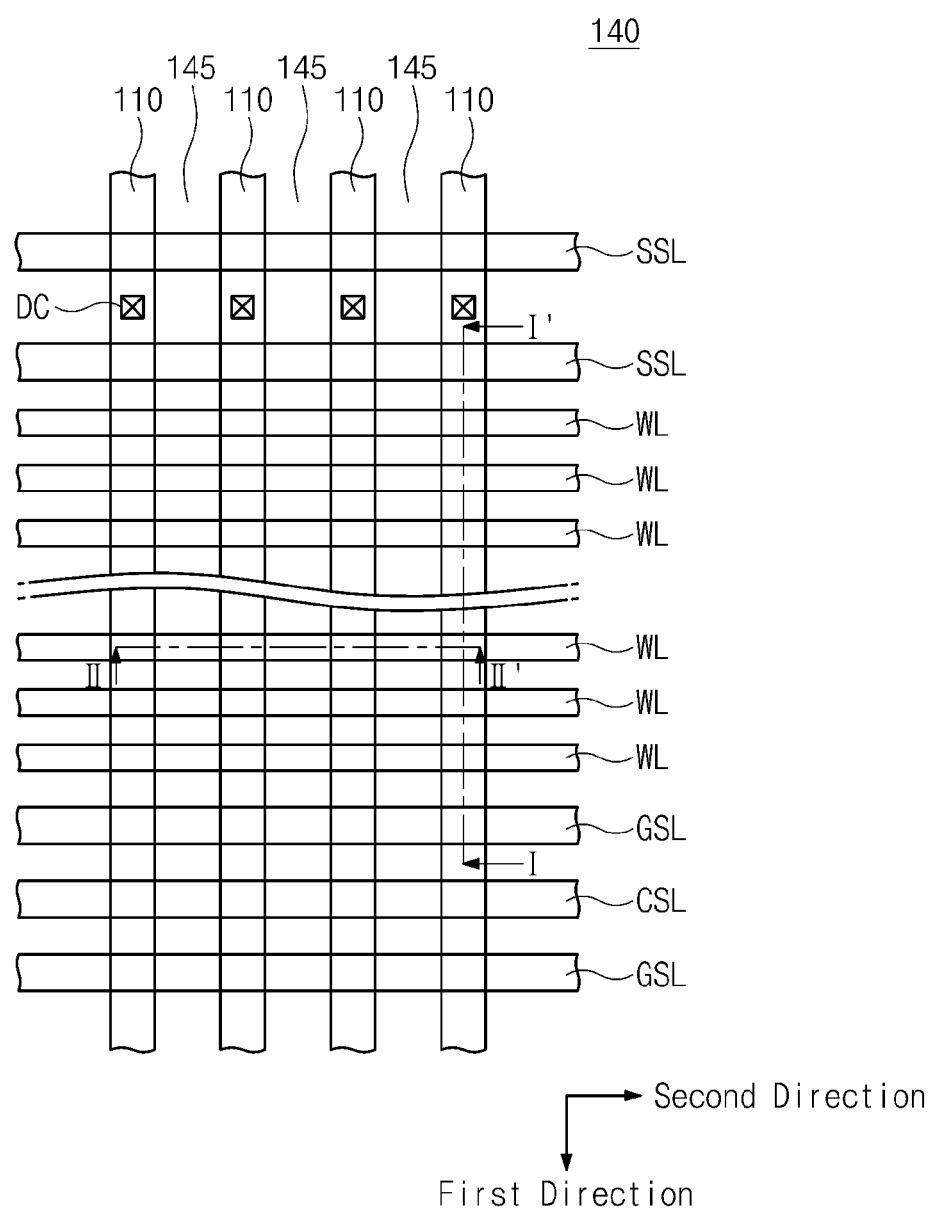
FIG. 6A illustrates a NAND nonvolatile memory device in accordance with embodiments of the invention.
Figure 6B:
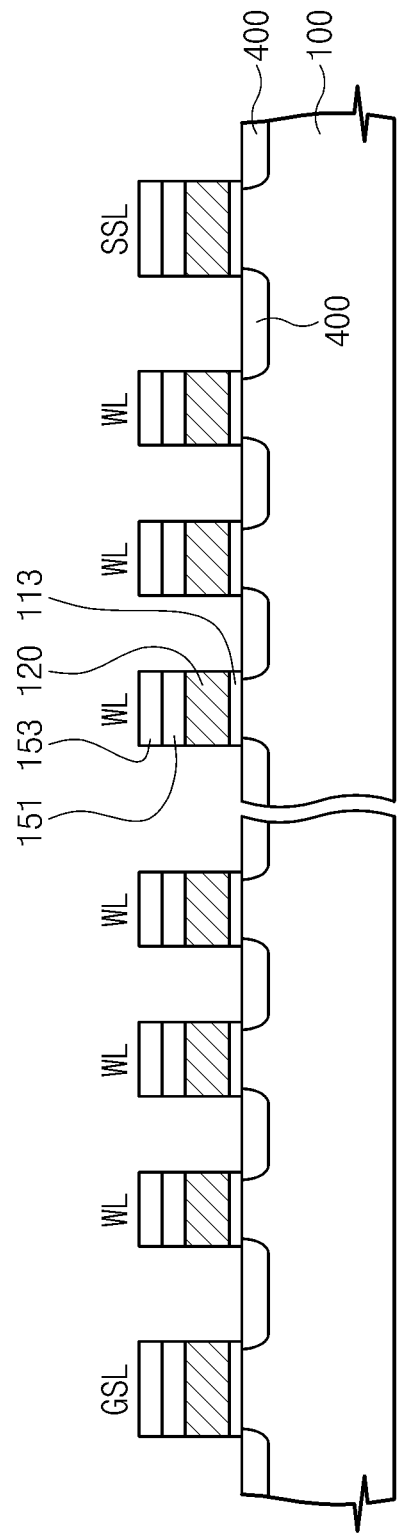
FIG. 6B is a cross-sectional view of the NAND nonvolatile memory device of FIG. 6A taken along the line I-I' of FIG. 6A.

FIGS. 6A and 6B illustrate a NAND nonvolatile memory device in accordance with embodiments of the invention. FIG. 6B is a cross-sectional view taken along the line I-I' of FIG. 6A. In addition, FIGS. 1 and 2 correspond to cross-sectional views taken along the line II-II' of FIG. 6A in accordance with embodiments of the invention.

Referring to FIGS. 6A and 6B, a NAND nonvolatile memory device in accordance an embodiment of the invention comprises a semiconductor substrate 100 comprising a cell region. FIGS. 6A and 6B each illustrate at least a portion of the cell region of the nonvolatile memory device. A device isolation layer 140 is disposed in semiconductor substrate 100 and comprises device isolation layer segments 145. The background of FIG. 6A illustrates device isolation layer 140. In addition, device isolation layer 140 defines active regions 110. Active regions 110 are arranged such that they each extend in a first direction and are parallel with one another.

A string selection line SSL and a ground selection line GSL each extend across active regions 100 and are parallel with one another. Additionally, a plurality of word lines WL extend across active regions 100 and are disposed between string selection line SSL and ground selection line GSL. String selection line SSL, ground selection line GSL, and word lines WL are all parallel with one another and each extend along a second direction that is perpendicular to the first direction. String selection line SSL, ground selection line GSL, and word lines WL may be included in a cell string group. Another cell string group may be disposed adjacent to the illustrated cell string group along the first direction. In addition, the two cell string groups may be symmetrical with respect to a straight line extending between the two cell string groups.

Impurity regions 400 corresponding to source/drain regions may be disposed in each active region 110 on both sides of each string selection line SSL, ground selection line GSL, and word line WL. A portion of a word line WL and the impurity regions 400 in an active region 110 and disposed on either side of that portion of the word line WL constitute a cell transistor. A portion of ground selection line GSL and the impurity regions 400 in an active region 110 and disposed on either side of that portion of ground selection line GSL constitute a ground selection transistor. A portion of a string selection line SSL and the impurity regions 400 in an active region 110 and disposed on either side of that portion of string selection line SSL constitute a string selection transistor.

Each word line WL comprises a tunnel insulating structure 113, a charge storage structure 120, a gate interlayer dielectric structure 151, and a control gate electrode 153, which are sequentially stacked on semiconductor substrate 100. A hard mask structure (not shown) may be disposed on control gate electrode 153. Ground and string selection lines GSL and SSL may have the same structure as word lines WL. Line widths of ground and string selection lines GSL and SSL may be different than the line widths of word lines WL. For example, the respective line widths of ground and string selection lines GSL and SSL may be greater than the respective line widths of word lines WL.

Charge storage structure 120 may comprise an upper charge storage structure and a lower charge storage structure, wherein an impurity concentration of the upper charge storage structure is greater than an impurity concentration of the lower charge storage structure.

Figure 7A:
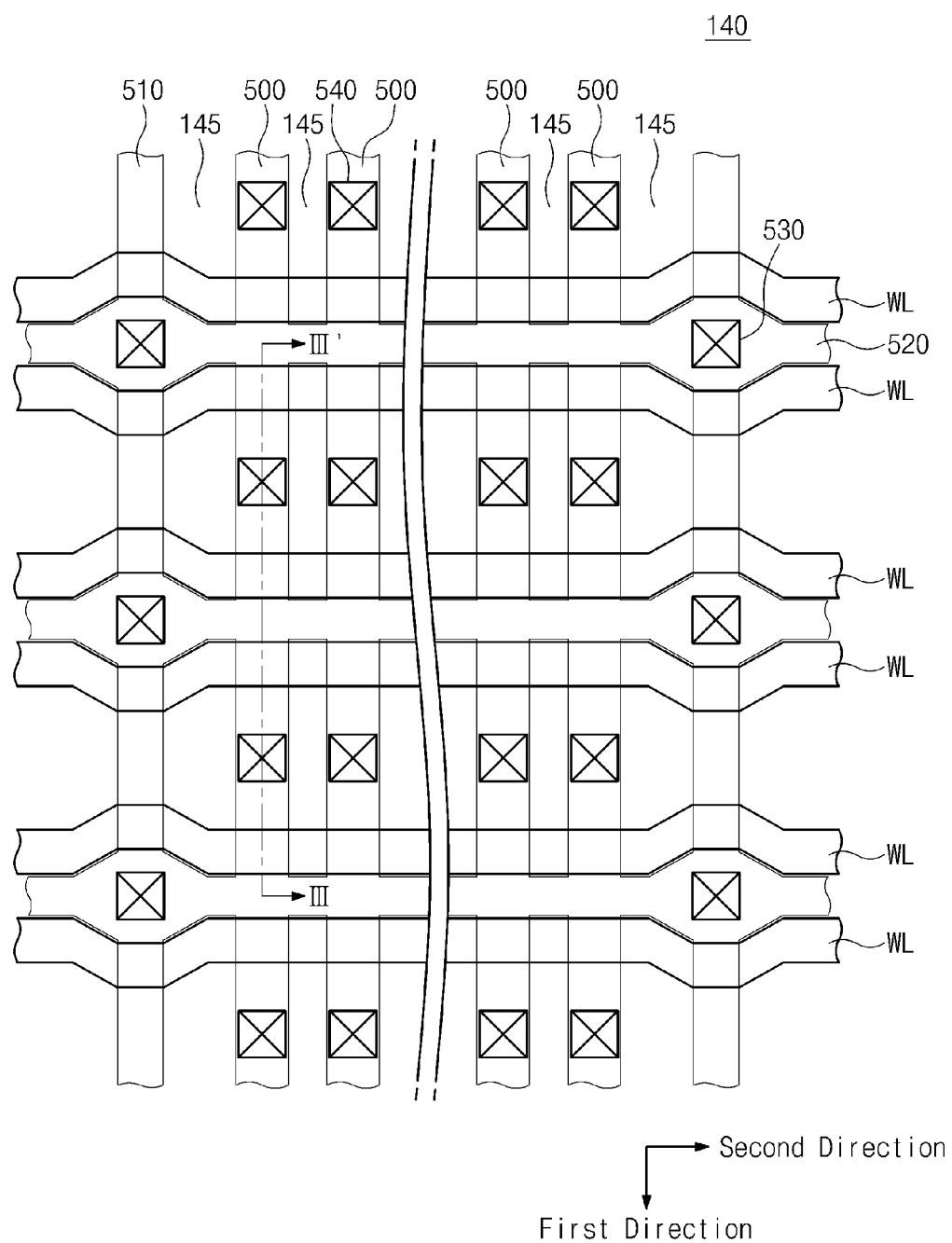
FIG. 7A illustrates a NOR nonvolatile memory device in accordance with an embodiment of the invention.
Figure 7B:
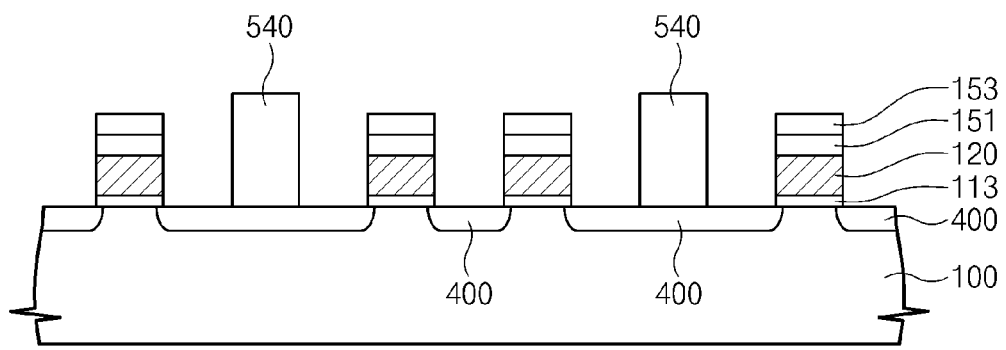
FIG. 7B is a cross-sectional view of the NOR nonvolatile memory device of FIG. 7A taken along the line III-III' of FIG. 7A.

FIGS. 7A and 7B illustrate a NOR nonvolatile memory device in accordance with another embodiment of the invention. FIG. 7B is a cross-sectional view taken along a line III-III' of FIG. 7A.

Referring to FIGS. 7A and 7B, a NOR nonvolatile memory device in accordance with an embodiment of the invention comprises a semiconductor substrate 100 comprising a cell region. FIGS. 7A and 7B each illustrate at least a portion of the cell region of the nonvolatile memory device. A device isolation layer 140 is disposed in semiconductor substrate 100. The background of FIG. 7A illustrates device isolation layer 140. In addition, device isolation layer 140 comprises device isolation layer segments 145. Device isolation layer 140 defines active regions 500, 510, and 520. First active regions 500 each extend in a first direction and are parallel with one another. Source strapping active regions 510 each extend in the first direction and are disposed at regular intervals between first active regions 500. Second active regions 520 each extend in a second direction, extend across first active regions 500, and are parallel with one another. Second active regions 520 perform a function of a source line.

The NOR nonvolatile memory device illustrated in FIGS. 7A and 7B comprises a pair of word lines WL extending substantially in a second direction perpendicular to the first direction, and extending across upper portions of first active regions 500 and source strapping active regions 510. Active regions disposed outside of (i.e., on either side of) the pair of word lines WL become a drain of a transistor, and an active region disposed between the word lines WL of the pair of word lines WL becomes a source of the transistor. The drain of the transistor is electrically connected to a bit line through a bit line contact plug 540.

The sources of adjacent transistors are electrically connected along the second direction through second active region 520. Second active region 520 performs a function of a source line. A source contact 530 is disposed at a location where second active region 520 crosses source strapping region 510.

Each word line WL comprises a tunnel insulating structure 113, a charge storage structure 120, a gate interlayer dielectric structure 151, and a control gate electrode 153, which are sequentially stacked on semiconductor substrate 100. Charge storage structure 120 may comprise an upper charge storage structure and a lower charge storage structure, wherein an impurity concentration of the upper charge storage structure is greater than an impurity of the lower charge storage structure.

A nonvolatile memory device in accordance with an embodiment of the invention may be included in an electronic system.

Figure 8:
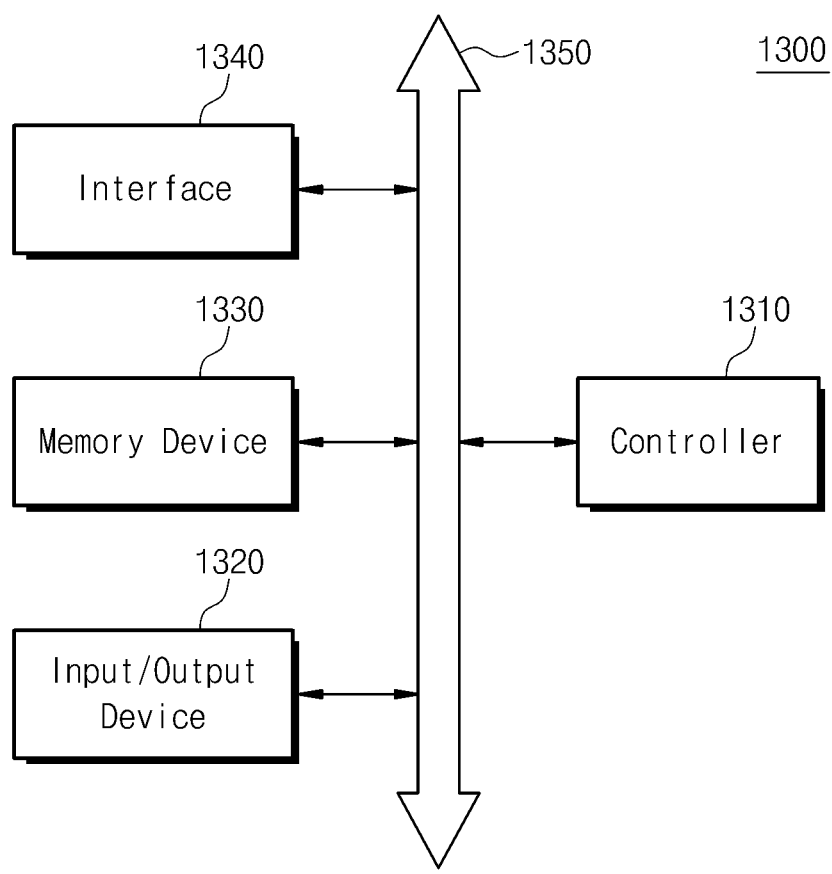
FIG. 8 is a block diagram illustrating an electronic system comprising a nonvolatile memory device in accordance with an embodiment of the invention.

FIG. 8 is a block diagram illustrating an electronic system comprising a nonvolatile memory device in accordance with an embodiment of the invention. Referring to FIG. 8, an electronic system 1300 may comprise a controller 1310, an input/output device 1320, and a memory device 1330. Controller 1310, input/output device 1320, and memory device 1330 may be connected to one another through a bus 1350. Bus 1350 corresponds to a path through which data is transferred. Controller 1310 may comprise at least one of a microprocessor, a digital signal processor, a microcontroller, and logic devices performing a function similar to that of the previously mentioned microprocessor, digital signal processor, and microcontroller.

Input/output device 1320 may comprise at least one of a key pad, a key board, and a display device. Memory device 1330 is a device that stores data. Memory device 1330 can store data and/or an instruction executed by controller 1310. Memory device 1330 may comprise a nonvolatile memory device in accordance with at least one embodiment of the invention. Electronic system 1300 may further comprise an interface 1340 for transferring data to a telecommunication network or receiving data from a telecommunication network. Interface 1340 may be a cable-type interface or a wireless interface. Interface 1340 may comprise an antenna or a transceiver.

Electronic system 1300 may be embodied by a mobile system, a personnel computer, an industrial computer, or a system performing multiple functions. The mobile system, for example, may be a personal digital assistant, a portable computer, a web tablet, a mobile phone, a wireless phone, a laptop computer, a memory card, a digital music system, or an information transferring/receiving system. If electronic system 1300 can perform wireless telecommunication, electronic system 1300 can be used in an interface protocol of a third generation telecommunication system such as CDMA, GSM, NADC, E-TDMA, WCDMA, and CDMA2000.

Figure 9:
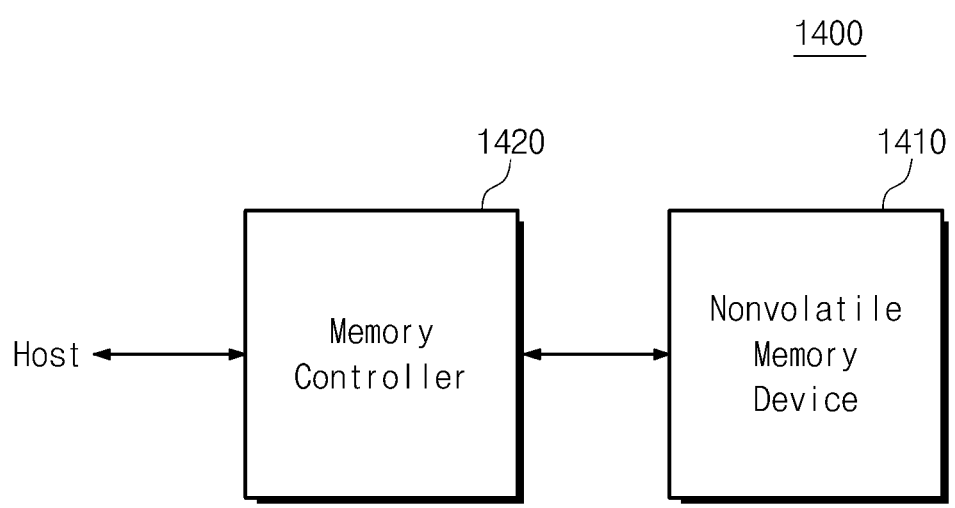
FIG. 9 is a block diagram illustrating a memory card having a nonvolatile memory device in accordance with an embodiment of the invention.

A memory card in accordance with an embodiment of the invention will be described with reference to FIG. 9. FIG. 9 is a block diagram showing a memory card comprising a nonvolatile memory device in accordance with an embodiment of the invention.

Referring to FIG. 9, a memory card 1400 comprises a nonvolatile memory device 1410 and a memory controller 1420. Nonvolatile memory device 1410 may store data or decode a stored data. Nonvolatile memory device 1410 comprises a nonvolatile memory device in accordance with at least one embodiment of the invention. In addition, memory controller 1420 controls nonvolatile memory device 1410 and causes nonvolatile memory device 1410 to store data or read stored data in response to a write or decode request from a host.

Embodiments of the invention have been described herein. However, various modifications may be made to the embodiments by one of ordinary skill in the art without departing from the scope of the invention as described in the accompanying claims.

What is claimed is:

1. A method of forming a nonvolatile memory device, the method comprising:
   forming a preliminary structure comprising an active region defined by an insulating layer in a semiconductor substrate, a tunnel insulating structure disposed on the active region, and a charge storage structure disposed on the tunnel insulating structure;
   treating the insulating layer to give an upper portion of the insulating layer an etching selectivity with respect to a lower portion of the insulating layer relative to a first etching process;
   etching the insulating layer using at least the first etching process to form a device isolation layer; and
   recessing the device isolation layer,
   wherein treating the insulating layer comprises implanting first impurities into the upper portion of the insulating layer, and implanting second impurities into the charge storage structure; and
   wherein the first and second impurities are the same one or more substances.

2. The method of claim 1, wherein etching the insulating layer using at least the first etching process to form the device isolation layer comprises:
   removing a portion of the upper portion of the insulating layer using the first etching process; and removing a portion of the lower portion of the insulating layer using an additional etching process.

3. The method of claim 1, wherein etching the insulating layer using at least the first etching process to form the device isolation layer comprises:
   removing all of the upper portion of the insulating layer using the first etching process; and
   removing a portion of the lower portion of the insulating layer using an additional etching process.

4. The method of claim 1, wherein, after recessing the device isolation layer segment, a center of an upper surface of the device isolation layer segment is disposed lower than an outer edge region of the device isolation layer segment.

5. The method of claim 1, further comprising forming a spacer on the outer edge region of the device isolation layer segment and on a sidewall of the charge storage structure.

6. The method of claim 1, wherein forming the preliminary structure comprises:
   sequentially forming a tunnel insulating layer and a charge storage layer on the semiconductor substrate;
   patterning the charge storage layer, the tunnel insulating layer, and the semiconductor substrate to form the charge storage structure, the tunnel insulating structure, and a trench in the semiconductor substrate; and
   forming an insulating layer by filling the trench with a preliminary insulating layer and planarizing the preliminary insulating layer.

7. The method of claim 1, wherein forming the preliminary structure comprises:
   sequentially forming a buffer oxide layer and a hard mask layer on the semiconductor substrate;
   patterning the buffer oxide layer, the hard mask layer, and the semiconductor substrate to form a hard mask structure, an oxide structure, and a trench in the semiconductor substrate;
   filling the trench with a preliminary insulating layer;
   planarizing the preliminary insulating layer to form the insulating layer;
   removing the hard mask structure and the oxide structure;
   forming a tunnel insulating structure and a charge storage layer on the semiconductor substrate; and
   forming the charge storage structure by planarizing the charge storage layer.

* * * * *